(12) United States Patent
Lenz

(10) Patent No.: US 6,838,012 B2
(45) Date of Patent: Jan. 4, 2005

(54) METHODS FOR ETCHING DIELECTRIC MATERIALS

(75) Inventor: Eric H. Lenz, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 177 days.

(21) Appl. No.: 10/284,251

(22) Filed: Oct. 31, 2002

(65) Prior Publication Data

US 2004/0084410 A1 May 6, 2004

(51) Int. Cl.[7] .............................. H01I 21/302; B44C 1/22
(52) U.S. Cl. ............................ 216/71; 216/76; 216/80; 438/714; 438/715
(58) Field of Search .......................... 216/71, 76, 80; 438/714, 715, 723, 724

(56) References Cited

U.S. PATENT DOCUMENTS

| | | |
|---|---|---|
| 4,340,462 A | 7/1982 | Koch |
| 4,595,484 A | 6/1986 | Giammarco et al. |
| 4,792,378 A | 12/1988 | Rose et al. |
| 4,820,371 A | 4/1989 | Rose |
| 4,948,458 A | 8/1990 | Ogle |
| 4,960,488 A | 10/1990 | Law et al. |
| 5,074,456 A | 12/1991 | Degner et al. |
| 5,200,232 A | 4/1993 | Tappan et al. |
| 5,569,356 A | 10/1996 | Lenz et al. |
| 5,820,261 A | 10/1998 | Yam |
| 5,820,723 A | 10/1998 | Benjamin et al. |
| 6,073,577 A | 6/2000 | Lilleland et al. |
| 6,090,304 A | 7/2000 | Zhu et al. |
| 6,297,163 B1 | 10/2001 | Zhu et al. |
| 6,376,385 B2 | 4/2002 | Lilleland et al. |
| 6,391,787 B1 | 5/2002 | Dhindsa et al. |
| 6,623,596 B1 * | 9/2003 | Collins et al. ......... 156/345.48 |
| 2001/0054601 A1 * | 12/2001 | Ding ........................ 216/68 |

* cited by examiner

Primary Examiner—George A. Goudreau
(74) Attorney, Agent, or Firm—Burns, Doane, Swecker & Mathis, LLP (57) ABSTRACT

Methods of etching dielectric materials in a semiconductor processing apparatus use a thick silicon upper electrode that can be operated at high power levels for an extended service life.

29 Claims, 5 Drawing Sheets

METHODS FOR ETCHING DIELECTRIC MATERIALS

BACKGROUND OF THE INVENTION

1. Field of the Invention

The invention relates to methods for etching dielectric materials in plasma reactors.

2. Description of the Related Art

In the field of semiconductor material processing, vacuum processing chambers are used for the etching of materials and for chemical vapor deposition (CVD) of materials onto substrates. A radio frequency (RF) field is applied to process gases flowed into the processing chamber to generate a plasma. Exemplary parallel plate, transformer coupled plasma (TCP™), which is also called inductively coupled plasma (ICP), and electron-cyclotron resonance (ECR) reactors and components are disclosed in commonly-assigned U.S. Pat. Nos. 4,340,462; 4,948,458; 5,200,232 and 5,820,723.

During plasma etching, plasma is formed above the masked surface of the substrate by adding large amounts of energy to a gas at relatively low pressure, resulting in ionizing of the gas. By adjusting the electrical potential of the substrate to be etched, charged species in the plasma can be directed to impinge substantially normally upon the wafer so as to remove materials in unmasked regions of the substrate.

It is desirable to evenly distribute the plasma over the surface of substrates to achieve uniform etching rates over the entire substrate surface. For example, U.S. Pat. Nos. 4,595,484, 4,792,378, 4,820,371, 4,960,488 disclose showerhead electrodes for providing uniform gas flow to a semiconductor substrate.

A reactive ion etching system typically includes an etching chamber in which an upper electrode or anode and a lower electrode or cathode are positioned. The cathode is negatively biased with respect to the anode and reaction chamber walls. The substrate to be etched is covered by a suitable mask and placed on the cathode. A chemically reactive gas is introduced into the etching chamber and maintained at a selected pressure. The upper electrode includes gas holes through which process gas is dispersed into the reaction chamber. The electric field established between the anode and the cathode dissociates the process gas to form plasma. A surface of the substrate is etched by chemical interaction with the active ions and by momentum transfer of the ions striking the surface of the substrate. The electric field created by the electrodes attracts ions to the cathode, causing the ions to strike the substrate surface and remove material from the substrate.

SUMMARY OF THE INVENTION

Methods for etching dielectric materials in a plasma processing apparatus are provided.

A preferred embodiment of a method of etching a dielectric material in a reaction chamber of a plasma etch reactor comprises placing the substrate comprising the dielectric material in the reaction chamber, which contains a thick silicon electrode and a second electrode. The silicon electrode is preferably an upper electrode and the second electrode is preferably a lower electrode. A process gas is introduced into the reaction chamber and a selected power level is applied to the silicon electrode, and heat is transferred from an edge portion of the silicon electrode. A plasma is generated from the process gas in the reaction chamber and the dielectric material is etched with the plasma.

In a preferred embodiment, the dielectric material has a low porosity. The thick silicon electrode can be used to etch such dielectric materials at high power levels.

According to a preferred embodiment, a plurality of substrates including a dielectric material are sequentially plasma etched, i.e., one at a time, in the reaction chamber using the thick silicon electrode. The silicon electrode can provide an extended service life as compared to thinner electrodes at high power levels.

BRIEF DESCRIPTION OF THE DRAWINGS

Various preferred embodiments of the invention will be readily understood by the following detailed description in conjunction with the accompanying drawings, in which.

DETAILED DESCRIPTION OF PREFERRED EMBODIMENTS

Methods of etching dielectric materials in a plasma processing apparatus are provided. Preferred embodiments of the methods utilize a thick upper electrode that can provide an extended service life in etching dielectric materials.

According to a preferred embodiment, a thick electrode is used as an upper electrode in a plasma reactor for processing a semiconductor substrate. For example, the electrode can be an upper electrode of a single wafer, parallel plate etch reactor in which a wafer is supported below the upper electrode on an electrostatic chuck including a lower electrode. Wafers having various sizes and compositions, such as a 200 mm or 300 mm silicon wafer, can be processed in the reactor. As described below, in preferred embodiments, the thick electrode is used to plasma etch dielectric materials provided on substrates.

The thick electrode can be a component of an electrode assembly. During plasma etching in a plasma reactor, electrodes are exposed to plasma and process gases in the reactor, which cause the electrodes to wear by erosion. As used herein, the term "erosion" includes wear by erosion and/or corrosion. As the electrode wears, its thickness is reduced. The electrode is a consumable part, which needs to be replaced periodically when it becomes excessively worn by erosion or fails. It has been determined that the thick electrode can provide an extended service life as compared to thinner electrodes in plasma etching processes for etching dielectric materials. In a preferred embodiment, the dielectric material is a low-porosity material having a relatively high thickness, such as, for example, from about 5,000 Å to about 10,000 Å. The thick electrode can be used in a plasma reaction chamber to etch such dielectric materials at high power levels. The thick electrode can provide an extended service life at such high power levels.

In a preferred embodiment, the electrode or electrode assembly is mounted to facilitate its removal from the plasma chamber. For example, the electrode can be mechanically clamped to a support by any suitable technique, such as techniques described in commonly-assigned U.S. Pat. No. 5,569,356 to Lenz et al., which is hereby incorporated by reference in its entirety. Alternatively, the electrode can be metallurgically or adhesively bonded to a support by any suitable technique, such as techniques described in commonly-assigned U.S. Pat. No. 5,074,456 to Degner et al., which is hereby incorporated by reference in its entirety. The electrode can also be bonded to a support by an elastomeric joint, such as those described in commonly-assigned U.S. Pat. No. 6,073,577 to Lilleland et al., which is hereby incorporated by reference in its entirety.

Figure 1:
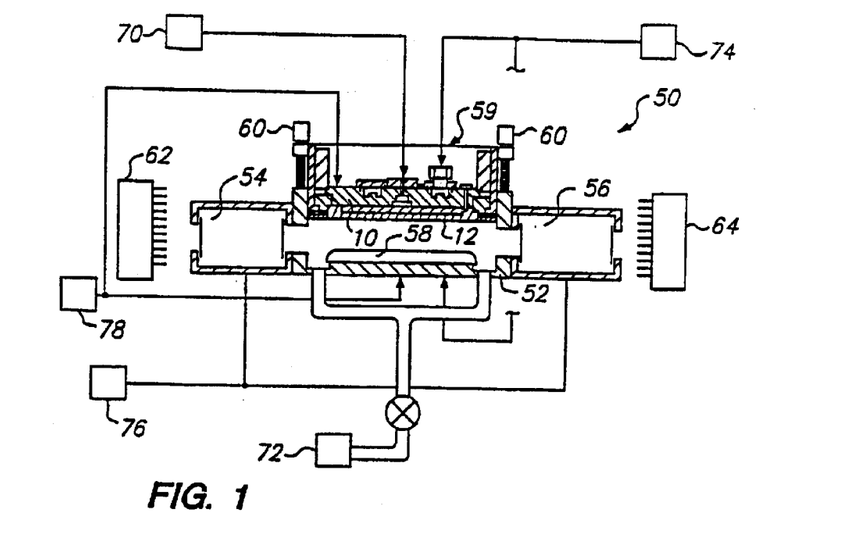
FIG. 1 illustrates a plasma reactor system in which an electrode according to the invention can be used.

The electrode can be used in various plasma etch systems, such as the plasma etch system illustrated in FIG. 1. The plasma etch system comprises an electrode assembly 10 including an upper electrode 12 located in a parallel plate reactor system 50 having a chamber 52, an inlet load lock 54, and an outlet load lock 56, further details of which are described in commonly-assigned U.S. Pat. No. 4,340,462, which is hereby incorporated by reference in its entirety. The chamber 52 includes a lower electrode plate 58, which supports a single wafer substrate on its top surface. The electrode assembly 10 is mounted in an upper housing 59. The upper housing 59 can be moved vertically by a mechanism 60 to adjust the gap between the electrode 12 and the electrode 58.

The load locks 54 and 56 include transfer devices to transfer wafers from a wafer supply 62, through the chamber 52, and out to a wafer receptacle 64. An etchant gas source 70 is connected to the housing 59 to deliver etchant gas comprising one or more gases to the electrode assembly 10. A vacuum pump arrangement 72 maintains a desired vacuum in the chamber, e.g., 0.001 to 10 Torr. A cooling water source 74 is connected to the upper electrode 12 and lower electrode 58 to maintain them at desired temperatures. A load lock pump arrangement 76 provides a desired vacuum pressure in the load locks 54 and 56. A power source 78 provides radio frequency (RF) power to the upper and/or lower electrodes 12 and 58.

Figure 2:
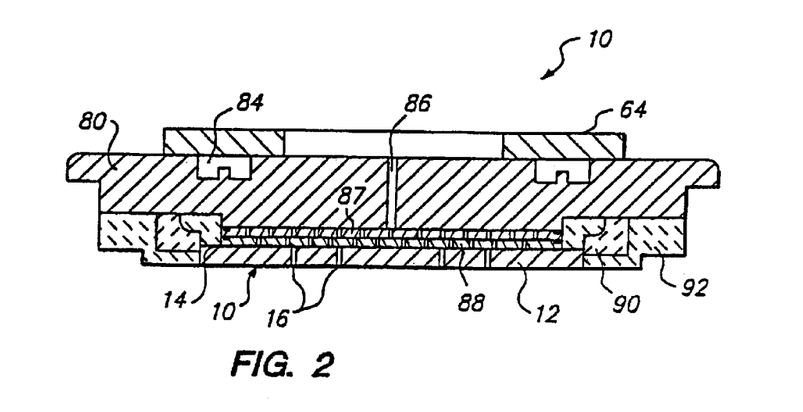
FIG. 2 is a side sectional view of a showerhead electrode assembly according to a first embodiment.

Details of a preferred embodiment of the electrode assembly 10 are shown in FIG. 2. An electrode 12 in the form of a disk is bonded to a support ring 14 by a suitable bonding technique, such as by brazing, soldering, adhesive bonding or the like. The electrode 12 comprises a showerhead electrode, which includes apertures 16 to distribute a process gas therethrough. The support ring 14 includes a flange and extension sized to engage the top surface of the electrode 12. The support ring 14 is secured to an electrically conductive backing plate 80, such as an aluminum plate, via fasteners (not shown). A cooling channel 84 covered by plate 64 forms a cooling duct for circulation of cooling water supplied by source 74. RF power from source 78 can be supplied to the plate 80 and conducted through the support ring 14 to the electrode 12 for energizing plasma in the chamber 52. Alternatively, the electrode 12 can be grounded to provide a ground path for plasma generated in the chamber by the lower electrode 58. Process gas from source 70 enters the plate 80 through passage 86 and then passes into a baffle arrangement including baffle plates 87 and 88. While two baffle plates are shown, any suitable baffle arrangement can be used. In a preferred embodiment, the baffles plates are not in contact with the top surface of the electrode 12. Alternatively, the baffle arrangement can be omitted. An inner insulating or conductive ring 90 and an outer insulating ring 92 surround the support ring 14, and both protect the support ring 14 from the plasma.

Figure 3:
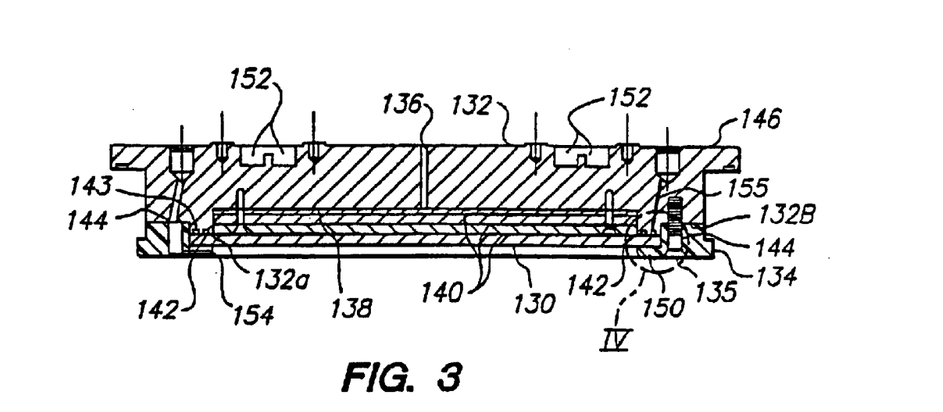
FIG. 3 is a side sectional view of a showerhead electrode assembly according to a second embodiment.
Figure 4:
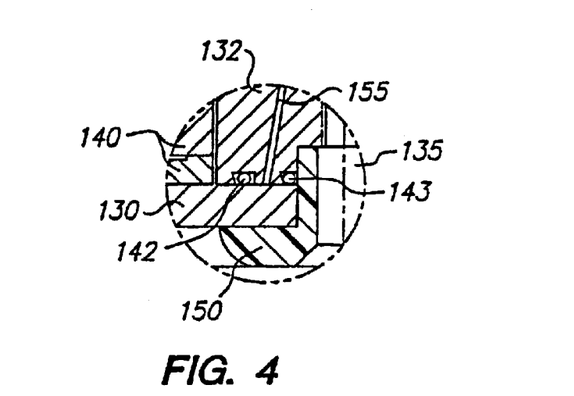
FIG. 4 is a side sectional view of a detail IV of the showerhead electrode assembly shown in FIG. 3.

The electrode can also be used in a captive electrode system, such as shown in FIGS. 3 and 4. The electrode assembly includes an electrode 130, a support member 132, and a plasma confinement ring 134 clamping the electrode 130 to the member 132. The ring 134 is attached to the support member 132 by fasteners 135 threaded into support member 132. The support member 132 includes a gas passage 136 to provide process gas to a recess 138 containing baffle plates 140. In a preferred embodiment, the baffles plates are not in contact with the top surface of the electrode 130. A bottom surface 132a of member 132 engages electrode 130 to supply RF power to the electrode and a radially outer surface 132b of support member 132 contacts a top surface of ring 134. A flange 146 of support member 132 allows attachment of the electrode assembly to the interior of a plasma reaction chamber. Cooling channels 152 in member 132 allow cooling of the electrode assembly. A flange 150 on ring 134 provides a resilient clamping force against an outer portion of the exposed surface of the electrode 130.

The confinement ring 134 is preferably made from a dielectric material, such as a heat resistant thermoset polymer (e.g., Vespel™ made by Dupont) which is stable in a plasma environment. Alternatively, the ring can be made from ceramic materials, such as one or more of alumina, zirconia, titania, silicon nitride, silicon carbide and the like, or a dielectric coated metal. If the ring is an inelastic material, the bolts 135 can be made of a suitable elastically deformable material, such as Vespel™, to provide the resilient clamping force on the electrode 130. Alternatively, the ring 134 and bolts 135 can be made of elastically deformable material. Details of suitable clamping arrangements are described in U.S. Pat. No. 5,569,356.

Chamber pressure in the plasma reaction chamber can be monitored via gas passage 154 in ring 134. A seal 144, such as an O-ring, surrounding passage 154 provides a seal between support member 132 and ring 134. To enhance thermal conduction between electrode 130 and support member 132, process gas can be supplied through passage 155 and maintained under pressure in a channel (not shown) in support member 132. Seals 142 and 143, such as O-ring seals, can be used to maintain gas under pressure in the channel.

Figure 5:
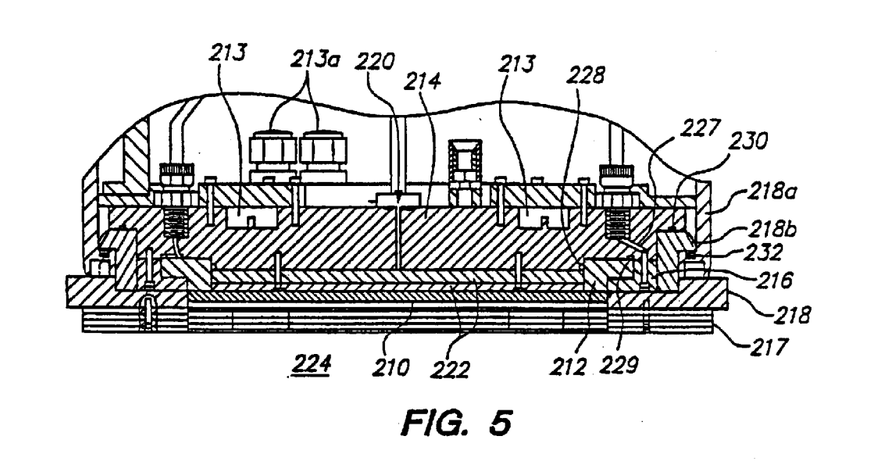
FIG. 5 is a side sectional view of an electrode assembly according to a third embodiment.
Figure 6:
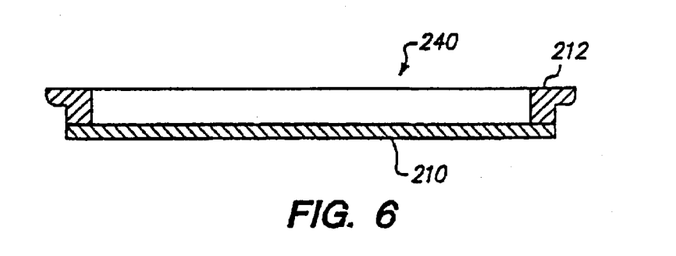
FIG. 6 shows details of the electrode assembly shown in FIG. 5.
Figure 7:
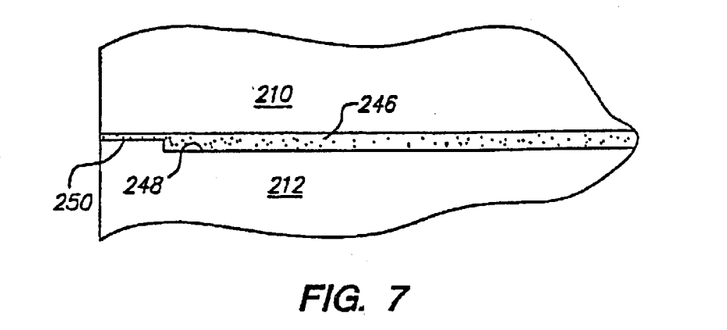
FIG. 7 is a side sectional view of a portion of the electrode assembly shown in FIG. 6.

FIGS. 5–7 illustrate another preferred embodiment in which an electrode 210 is bonded to a support ring 212 by an elastomeric joint 246. The electrode 210 is a planar disk having uniform thickness from its center to its edge. An outer flange on ring 212 is clamped by a clamping ring 216, such as an aluminum clamping ring, to an aluminum temperature-controlled member 214 having water cooling channels 213. Water is circulated in the cooling channels 213 by water inlet/outlet connections 213a. A plasma confinement ring 217 comprised of a stack of spaced-apart rings, such as quartz rings, surrounds the outer periphery of electrode 210. The plasma confinement ring 217 is bolted to a dielectric annular ring 218, which is bolted to a dielectric housing 218a. The confinement ring 217 causes a pressure differential in the reactor and increases electrical resistance between the reaction chamber walls and the plasma, which confines plasma between upper electrode 210 and a lower electrode (not shown). A radially inwardly extending flange of clamping ring 216 engages the outer flange of support ring 212. No clamping pressure is applied directly against the exposed surface of electrode 210.

Process gas from a gas supply is supplied to the electrode 210 through a central hole 220 in the temperature-controlled member 214. The process gas is distributed through one or more vertically spaced apart baffle plates 222 and passes through gas distribution holes (not shown) in the electrode 210 to evenly disperse the process gas into reaction chamber 224. In a preferred embodiment, the baffles plates are not in contact with one or more regions on the top surface of the electrode 210. To provide enhanced heat conduction from electrode 210 to temperature-controlled member 214, process gas can be supplied to fill open spaces between opposed surfaces of temperature-controlled member 214 and support ring 212. In addition, gas passage 227 connected to a gas passage (not shown) in the annular ring 218 or confinement ring 217 allows pressure to be monitored in the reaction chamber 224. To maintain process gas under pressure between temperature-controlled member 214 and support ring 212, a seal 228, such as an O-ring, is provided between an inner surface of support ring 212 and an opposed surface of temperature-controlled member 214, and a seal 229, such as an O-ring, is provided between an outer part of a top surface of support ring 212 and an opposed surface of member 214. To maintain the vacuum environment in chamber 224, seals 230, 232, such as O-rings, are provided between temperature-controlled member 214 and cylindrical member 218b, and between cylindrical member 218b and housing 218a.

FIG. 6 shows further details of a showerhead assembly 240 including the electrode 210 bonded to the electrically conductive support ring 212 by an elastomeric joint 246. Elastomeric joint 246 can be located in a recess 248, as shown in FIG. 7. The recess 248 preferably extends continuously around the support ring 212 between an inner wall (not shown) and an outer wall 250 of the support ring 212. Each wall 250 can be as thin as possible, e.g. about 30 mils wide, which allows the elastomer to form a thin layer (e.g., about 2 $\mu$m thick in cases where the elastomer optionally includes 0.7 to 2 $\mu$m sized filler, such as conductive particles of aluminum, silicon, silicon carbide, or the like) in the area in contact with each wall 250 and a thicker layer (e.g., about 0.0025 inch) in the recess 248. The recess formed by the walls can be extremely shallow, e.g., about 2 mils deep, which provides a very thin elastomeric joint having sufficient strength to adhesively bond the electrode 210 to the support ring, yet allow movement of the electrode 210 relative to the support ring 212 during temperature cycling of the electrode assembly. Additionally, the walls of the recess can protect the elastomeric joint from attack by the plasma environment in the reactor. The recess 248 can be omitted and the elastomer bond can be provided as isolated or continuous thin beads of elastomer between mating planar surfaces of the electrode 210 and a support member. For example, the elastomer can be deposited as one or more thin annular beads between the electrode and a support member.

The thick electrode can be composed of different materials including, for example, silicon carbide, graphite, polycrystalline silicon and single crystal silicon. In a preferred embodiment, the thick electrode is composed of single crystal silicon. During processing of substrates in a plasma reaction chamber, the supply of RF current to the upper electrode causes the upper electrode to become heated across its top and bottom surfaces. The top surface of the upper electrode preferably contacts only the support ring. In such arrangements, heat is transferred by conduction from the upper electrode only at the perimeter of the electrode by the support ring, producing a parabolic temperature distribution from the center to the edge of the electrode. Compressive stress is developed in the center of the electrode, while tensile stress is developed at the edge of the electrode. If the magnitude of the tensile stress becomes too high, the electrode can crack and fail immediately.

It has been determined that the upper electrode can crack and fail due to such thermal stress as the electrode is worn in the etch chamber by exposure to plasma and reactive process gases. This erosion decreases the thickness of the electrode. It has been discovered that increasing the thickness of the electrode decreases the temperature gradient between the center and edge of the electrode. Consequently, thermal stresses produced by the temperature gradient are reduced by increasing the electrode thickness. It has been determined that this effect on the temperature gradient is enhanced for a silicon electrode because silicon's thermal conductivity decreases with temperature.

It has also been determined that the maximum power level at which the electrode can be operated without thermal stress-related failure is proportional to the electrode thickness. As used herein, the term "total power level" is the power applied at a given time between both the upper electrode and lower electrode. The total power is typically approximately equally absorbed by the upper and lower electrodes when both electrodes have an approximately equal surface area exposed to plasma. For example, at a total power level of 5,000 watts, the upper and lower electrodes each operate at 2,500 watts when they equally absorb power.

In some embodiments, the upper electrode or the lower electrode can be the powered electrode, while the other of the upper electrode or the lower electrode is the electrically grounded electrode. In other embodiments, both the upper electrode and lower electrode can be powered, with the two electrodes powered out of phase with respect to voltage from each other. The etch reactor can be a single-frequency or dual-frequency plasma reactor. For example, a plasma can be generated by supplying RF power to both the upper and lower electrodes, with a lower frequency used for the lower electrode than for the upper electrode. Alternatively, the upper electrode can be electrically grounded and RF power at two different frequencies (e.g., about 10–50 MHz and less than about 10 MHz) can be supplied to the lower electrode.

Figure 8:
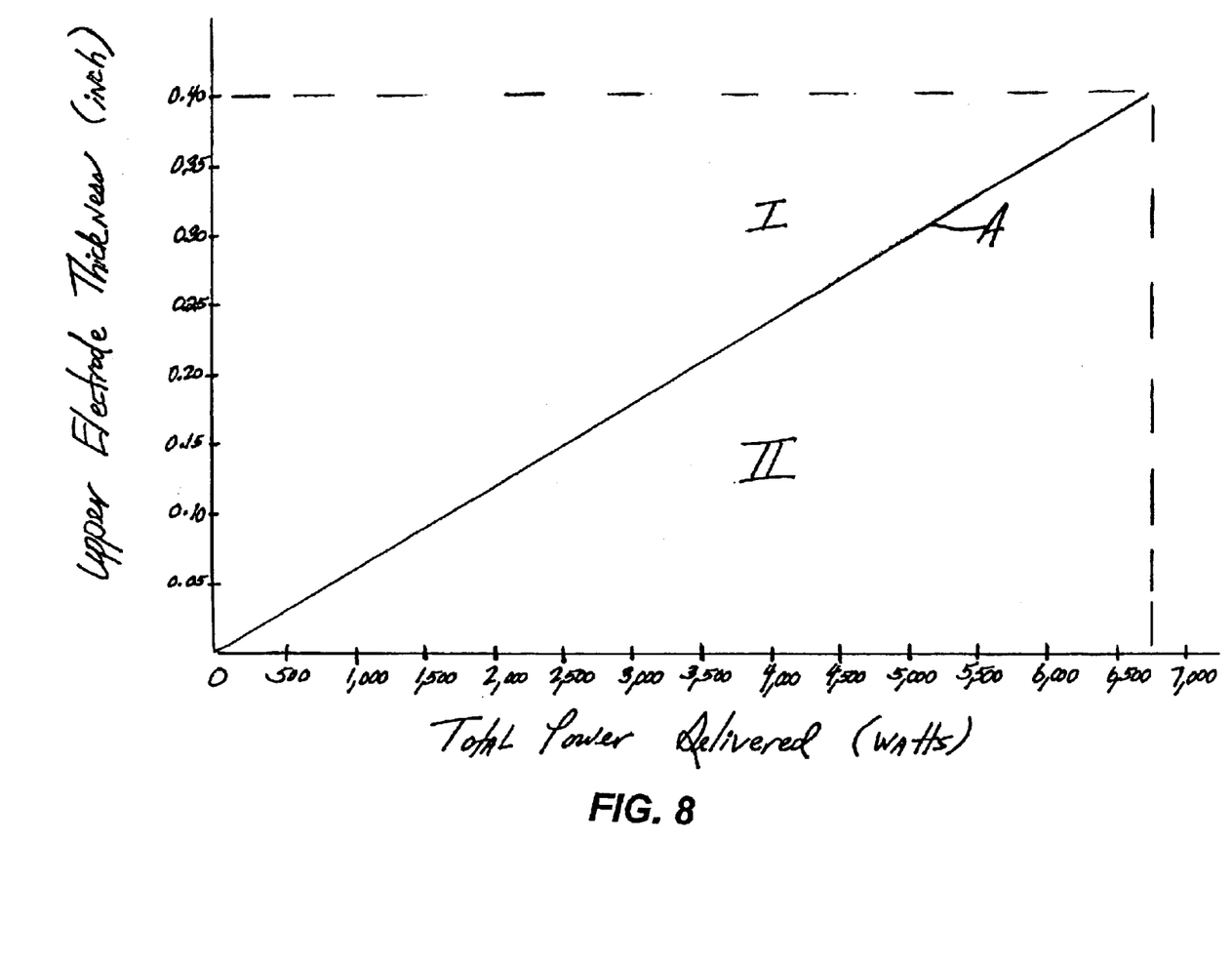
FIG. 8 illustrates the relationship between upper electrode thickness and total power level (applied between upper and lower electrodes), showing the preferred operating range I and a failure range II of the upper electrode.

FIG. 8 illustrates the relationship that has been determined between the upper electrode thickness and total power level in a plasma reactor including an upper silicon electrode and a lower electrode. FIG. 8 was determined using plate-shaped, silicon upper electrodes having an 8.8 inch diameter and different thicknesses using an Exelan™ processing chamber available from Lam Research Corporation in Fremont, Calif. The total power was approximately equally absorbed by the upper and lower electrodes of the reactor. Region I above line A represents a preferred operating range of the upper electrode. Region II below line A represents a failure range of the upper electrode. At a given upper electrode thickness, power level values within region II produce thermal stresses in the upper electrode that are sufficiently high to cause the upper electrode to fail immediately, while at the same upper electrode thickness, power level values within region I do not produce thermal stresses in the upper electrode sufficiently high to cause the upper electrode to fail. Accordingly, the upper electrode is operated in region I.

As shown in FIG. 8, by increasing the upper electrode thickness, the power that can be delivered by the upper electrode without failure increases. For example, an upper electrode thickness of 0.3 inches can absorb up to about 2,500 watts of power without failure of the upper electrode. An upper electrode thickness of 0.4 inches can absorb up to about 3400 watts of power without failure.

However, it has been determined that as the upper electrode wears by erosion during service in a plasma reaction chamber, the maximum power level that the upper electrode can deliver without failure also decreases. For example, FIG. 8 shows that when the upper electrode thickness is decreased from 0.3 inch to 0.25 inch, the power level that the upper electrode can absorb at the reduced thickness without immediate failure is decreased to about 2,100 watts. Because the silicon upper electrode wears by erosion during plasma etching, in a preferred embodiment, the upper electrode is operated at a selected power level that is below the maximum power level that causes immediate failure of an upper electrode of that thickness. For example, for an upper electrode having a thickness of 0.30 inch, the upper electrode can be operated in a plasma reactor at a power level of at least about 1,500 watts absorbed in the upper electrode for an extended period of time without failure. By operating the upper electrode at such lower power level below the maximum power level, the upper electrode can continue to be operated in region I as the thickness of the upper electrode is reduced by wear during plasma processing.

Typically, for processing 200 mm wafers, the silicon electrode has a diameter of about 9 inches. The thickness t of the silicon electrode preferably is substantially constant. The minimum thickness t is preferably from about 0.27 inch to about 0.4 inch, and more preferably from about 0.30 inch to about 0.35 inch.

The support ring can be made of any suitable material including, for example, graphite or silicon carbide. The support ring typically has a width w of about 0.5 inch. When a support ring having this size is used with a silicon electrode having an 9 inch diameter, the portion of the top surface of the silicon electrode that does not contact any other surface in the reactor chamber is about 8 inches in diameter.

Figure 9:
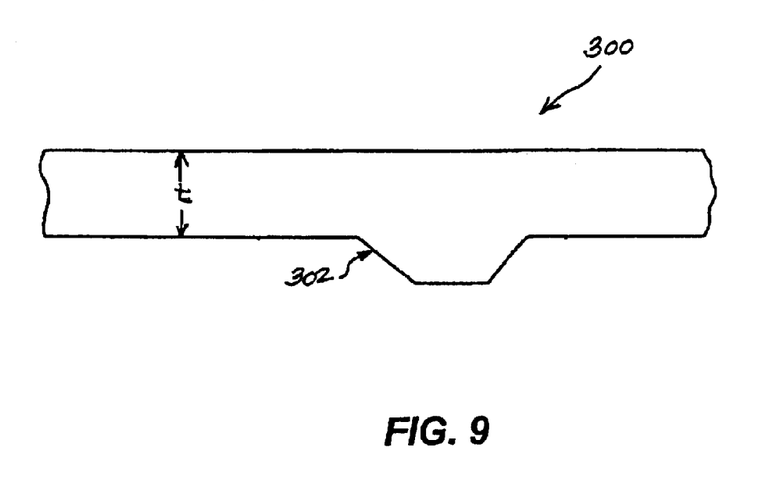
FIG. 9 shows an embodiment of a stepped electrode.

Alternatively, the upper electrode can be a stepped electrode as described in commonly-assigned U.S. Pat. No. 6,391,787, which is incorporated herein by reference in its entirety. FIG. 9 illustrates a preferred embodiment of a silicon stepped electrode 300 including a step 302. The electrode 300 has a minimum thickness t excluding the step of from about 0.27 inch to about 0.4 inch, and more preferably from about 0.30 inch to about 0.35 inch.

The electrode assembly can be used in a plasma reaction chamber to etch various dielectric materials including, but not limited to, doped silicon oxide, e.g., fluorinated silicon oxide (FSG); undoped silicon oxide, such as silicon dioxide; spin-on-glass (SOG); silicate glasses, such as boron phosphate silicate glass (BPSG) and phosphate silicate glass (PSG); low-k materials, doped or undoped thermally grown silicon oxide; doped or undoped TEOS deposited silicon oxide, and the like. Dopants for dielectric materials can include, but are not limited to, boron, phosphorus and/or arsenic.

In a preferred embodiment, the dielectric material that is etched can have a high density of at least about 90% of its theoretical density (i.e., a low porosity level), such as $SiO_2$ or $Si_3N_4$. Dielectric materials having such high density are difficult to etch and a high power etch process is preferred. Low density materials, such as low-k materials, are less difficult to etch and lower electrode power levels can be used.

In a preferred embodiment, such high-density dielectric materials having a thickness of at least about 5,000 Å and up to about 10,000 Å can be etched. As the dielectric material thickness increases, the amount of time needed to etch through the dielectric material increases. For example, for etching a high-density dielectric material having a thickness of at least about 5,000 Å, at a total electrode power of about 2,500 watts, the etching time can typically be greater than about 1 minute, such as, about 2–5 minutes. An overetch step typically is performed.

The dielectric material can overlie a conductive or semi-conductive layer, such as polycrystalline silicon; metals, such as aluminum, copper, titanium, tungsten, molybdenum and alloys thereof; nitrides, such as titanium nitride; and metal silicides, such as titanium silicide, cobalt silicide, tungsten silicide, molydenum silicide, and the like. In a preferred embodiment, the dielectric material can overlie a pad on a wafer.

In preferred embodiments, the thick silicon electrode is used as an upper electrode in a medium-density or high-density plasma etch reactor. Exemplary plasma reactors in which the thick silicon electrode can be used include the Exelan™ and 4520 XLe™ processing chambers available from Lam Research Corporation of Fremont, Calif. Those skilled in the art will appreciate that these reaction chambers are only exemplary plasma etch reactors in which the thick silicon electrode can be used.

The silicon electrodes can be used in various plasma atmospheres for etching different dielectric materials. Typical etch chemistries include, e.g., chlorine-containing gases including, but not limited to, $Cl_2$, HCl and $BCl_3$; oxygen-containing gases including, but not limited to, $O_2$, $H_2O$ and $SO_2$; fluorine-containing gases including, but not limited to, $CF_4$, $C_2F_6$, $C_3F_8$, $C_4F_8$, $CHF_3$, $CH_2F_2$, $CH_3F$, $NF_3$ and $SF_6$; and inert and other gases including, but not limited to He, Ne, Kr, Xe, Ar and $N_2$. Argon aids fluorine in attacking dielectric materials, such as silicon oxide. For instance, in a high-density plasma reactor, argon can be supplied into the reactor in amounts of about 25 to 300 sccm. The carrier gas preferably aids the dielectric etch rate, e.g., the oxide etching rate can be increased due to sputtering of the oxide. These and other gases may be used in combination as the etch gas used in a dielectric etching process.

Exemplary plasma reactor etching operating conditions for etching a dielectric material, such as $SiO_2$, are as follows: wafer diameter of 200 mm; dielectric material thickness of at least about 5,000 Å; dielectric material density of at least about 90% of theoretical density; lower electrode temperature of from about 0° C. to about 90° C.; chamber pressure of from about 0 Torr to about 10 Torr; process gas flow rate of from about 10 sccm to about 1,000 sccm; thick single crystal silicon upper electrode thickness (at beginning of its service life) 0.27 inch to 0.40 inch; total power delivered between the upper electrode and the lower electrode of at least about 2,500 watts; dual frequency; etch time for dielectric material of at least about 1 minute; and service life of upper electrode of at least about 250 hours. In a preferred embodiment, the dielectric material is etched to expose a pad on a silicon wafer.

By utilizing the thick silicon electrode, the power level that can be delivered by the upper electrode without failure is increased. High-density, thick dielectric materials can be etched using a high electrode power level and long etching times. Consequently, the etch rate of dielectric materials can be increased using the thick upper electrode. For example, etch rates of dielectric materials of at least about 6,000 angstroms/min can be obtained using the thick electrodes.

In addition, the thick silicon upper electrode can provide increased service life as compared to thinner electrodes. For example, a silicon upper electrode having an initial thickness of about 0.30 inch (i.e., the thickness before the electrode has been worn by erosion) can deliver at least about 1,500 watts without failure until its thickness is decreased to about 0.1 inch by erosion during plasma processing substrates. The silicon electrode having a thickness of from about 0.27 inch to about 0.4 inch preferably has an RF lifetime (i.e., the amount of time during which a plasma is generated in a plasma reactor using the electrode) of at least about 250 hours, and more preferably at least about 500 hours, when operated at a power level within region I.

While the invention has been described in detail with reference to specific embodiments thereof, it will be apparent to those skilled in the art that various changes and modifications can be made, and equivalents employed, without departing from the scope of the appended claims.

What is claimed is:

1. A method of etching a dielectric material in a reaction chamber of a plasma etch reactor, comprising:
    a) placing a substrate comprising a dielectric material on a substrate support in a reaction chamber of a plasma etch reactor, the reaction chamber containing a lower electrode and a showerhead electrode assembly including a silicon upper electrode having a minimum thickness of at least about 0.27 inch;
    b) introducing a process gas into the reaction chamber;
    c) applying a selected power level to the upper electrode:
    d) transferring heat from an edge portion of the upper electrode;
    e) generating a plasma from the process gas in the reaction chamber; and
    f) etching the dielectric material with the plasma.

2. The method of claim 1, wherein the maximum thickness of the upper electrode is from about 0.3 inch to about 0.4 inch.

3. A method of etching a dielectric material in a reaction chamber of a plasma etch reactor, comprising:
    placing a substrate comprising a dielectric material in a reaction chamber of a plasma etch reactor, the reaction chamber containing a lower electrode and a stepped silicon upper electrode having a minimum thickness of at least about 0.27 inch;
    introducing process gas into the reaction chamber;
    generating a plasma from the process gas in the reaction chamber; and
    etching the dielectric material with the plasma.

4. The method of claim 1, wherein the upper electrode is of single crystal silicon.

5. The method of claim 1, wherein the upper electrode has a service life of at least about 250 RF hours at the selected power level.

6. The method of claim 1, wherein the selected power level is at least about 1,250 watts.

7. The method of claim 1, wherein the dielectric material has a thickness of at least about 5,000 Å and the dielectric material is etched for at least about 1 minute with the plasma.

8. The method of claim 1, wherein the dielectric material is silicon oxide or silicon nitride.

9. A method of etching a dielectric material in a reaction chamber of a plasma etch reactor, comprising:
    placing a substrate comprising a dielectric material in a reaction chamber of a plasma etch reactor, the reaction chamber containing a lower electrode and a silicon upper electrode having a minimum thickness of at least about 0.27 inch;
    introducing process gas into the reaction chamber;
    generating a elasma from the process gas in the reaction chamber;
    conducting heat from the upper electrode only at an edue portion of the upper electrode; and
    etching the dielectric material with the plasma.

10. The method of claim 3, wherein the upper electrode is in a showerhead electrode assembly.

11. The method of claim 1, further comprising etching a plurality of different substrates during the service life of the upper electrode.

12. The method of claim 1, comprising applying RF power at a first frequency to the upper electrode and applying RF power at a second frequency lower than the first frequency to the lower electrode.

13. The method of claim 1, comprising applying RF power at two different frequencies to the lower electrode.

14. A method of etching a dielectric material in a reaction chamber of a plasma etch reactor, comprising:
    placing a substrate comprising a dielectric material on a substrate support in a reaction chamber of a plasma etch reactor, the reaction chamber containing a lower electrode and a showerhead electrode assembly including a silicon upper electrode having a minimum thickness of at least about 0.27 inch;
    introducing a process gas into the reaction chamber;
    generating a plasma from the process gas in the reaction chamber; and
    etching the dielectric material with the plasma.

15. The method of claim 14, wherein the minimum thickness of the upper electrode is from about 0.3 inch to about 0.4 inch.

16. The method of claim 14, wherein the upper electrode is a stepped electrode.

17. The method of claim 14, wherein the upper electrode has a service life of at least about 250 RF hours.

18. The method of claim 14, wherein the dielectric material is etched for from about 2 minutes to about 5 minutes with the plasma.

19. The method of claim 14, wherein the dielectric material is silicon oxide or silicon nitride.

20. The method of claim 14, wherein heat is conducted from the upper electrode only at an edge portion of the upper electrode.

21. The method of claim 9, wherein the upper electrode is in a showerhead electrode assembly.

22. The method of claim 14, further comprising etching a plurality of different substrates in the reaction chamber.

23. The method of claim 14, comprising applying RF power at a first frequency to the upper electrode and applying RE power at a second frequency lower than the first frequency to the lower electrode.

24. The method of claim 14, comprising applying RF power at two different frequencies to the lower electrode.

25. A method of etching a dielectric material in a reaction chamber of a plasma etch reactor, comprising:
    placing a substrate comprising silicon oxide or silicon nitride on a substrate support in a reaction chamber of a plasma etch reactor;

introducing a fluorine-containing process gas into the reaction chamber with a showerhead electrode assembly, the showerhead electrode assembly including a single crystal silicon upper electrode having a minimum thickness of at least about 0.3 inch and a lower electrode;

generating a plasma from the process gas in the reaction chamber; and etching the silicon oxide or silicon nitride with the plasma.

26. The method of claim 25, wherein the upper electrode has a service life of about 250 hours.

27. The method of claim 25, wherein the upper electrode has a minimum thickness of from about 0.3 inch to about 0.4 inch prior to being worn by erosion in the reaction chamber.

28. The method of claim 25, comprising applying RF power at a first frequency to the upper electrode and applying RF power at a second frequency lower than the first frequency to the lower electrode.

29. The method of claim 25, comprising applying RF power at two different frequencies to the lower electrode.

* * * * *